(12) United States Patent
Lam

(10) Patent No.: US 9,184,731 B2
(45) Date of Patent: Nov. 10, 2015

(54) METHOD AND APPARATUS FOR PREVENTING DIGITAL STEP ATTENUATOR OUTPUT POWER PEAKING DURING ATTENUATION STATE TRANSITIONS

(71) Applicant: PEREGRINE SEMICONDUCTOR CORPORATION, San Diego, CA (US)

(72) Inventor: Fleming Lam, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 217 days.

(21) Appl. No.: 14/108,105

(22) Filed: Dec. 16, 2013

(65) Prior Publication Data

US 2015/0171828 A1    Jun. 18, 2015

(51) Int. Cl.
*H03H 11/24* (2006.01)
*H01P 1/22* (2006.01)

(52) U.S. Cl.
CPC .................................. *H03H 11/245* (2013.01)

(58) Field of Classification Search
CPC .................................................... H03H 11/245
USPC ................. 333/81 R; 327/308, 309
See application file for complete search history.

(56) References Cited

U.S. PATENT DOCUMENTS

2008/0233913 A1* 9/2008 Sivasubramaniam .... H04B 1/18
455/232.1
2014/0002214 A1* 1/2014 Bawell ....................... H01P 1/22
333/81 R

OTHER PUBLICATIONS

IDT F1953 Datasheet, "6-bit Digital Step Attenuator", 400 to 4000 MHz IDTF1953, Glitch-Free Digital Step Attenuator, Rev 1, May 2013, pp. 1-17.

* cited by examiner

*Primary Examiner* — Stephen E Jones
*Assistant Examiner* — Scott S Outten
(74) *Attorney, Agent, or Firm* — Jaquez Land Richman LLP; Martin J. Jaquez, Esq.; John Land, Esq.

(57) ABSTRACT

A method and circuit for significantly reducing positive switching transients (glitches) of digital step attenuators (DSA's) by controlling the timing of state transitions for individual attenuator stages within a DSA. Such control prevents the DSA output power from peaking during attenuation state transitions and ensures that any transient glitch during the transition results in reduced power at the DSA output. Attenuation stage timing delay can be implemented on an integrated circuit die or "chip" for monolithic implementations of a DSA by adding circuitry which ensures that any attenuation state changes result in increased attenuation rather than decreased attenuation, thereby reducing or eliminating positive transient glitches at the DSA output.

12 Claims, 6 Drawing Sheets

METHOD AND APPARATUS FOR PREVENTING DIGITAL STEP ATTENUATOR OUTPUT POWER PEAKING DURING ATTENUATION STATE TRANSITIONS

BACKGROUND (1) Technical Field

This invention generally relates to electronic circuits, and more specifically to digital step attenuator circuits.

(2) Background

An attenuator is an electronic device that reduces the power of a signal without appreciably distorting its waveform. Attenuators are usually passive devices made from simple voltage divider networks, and are frequently used to lower voltage, dissipate power, and/or to improve impedance matching. For example, in measuring signals, attenuators are used to lower the amplitude of a signal under test a known amount to enable measurements, or to protect the measuring device from signal levels that might damage it. Attenuators are also used to match impedance by lowering the apparent standing wave ratio (SWR).

Digital step attenuators (DSA's) are frequently used with radio frequency (RF) systems such as transceivers for broadcast radio, cellular telephones, and RF based digital networks (e.g., WiFi, Bluetooth). Typical DSA's consist of a series cascade of switchable (2-state), impedance-matched attenuator stages, whose attenuation values are binary weighted. For example, FIG. 1 is a schematic diagram of a typical prior art binary-weighted DSA 100. Shown are 7 attenuator stages comprising series-connected switchable (2-state) "pi" type attenuators 102 and "bridged-r" type attenuators 104.

In operation, a 7-bit binary code is applied to the control lines C16-C0.25 of the DSA 100 to select any or all of the attenuator stages 102, 104 to attenuate a signal between the input port RFin and the output port RFout, in equal increments (0.25 dB per step in this example). Thus, for the illustrated embodiment, a binary control signal of "0111111" will provide an attenuation (negative gain) of −15.75 dB, while a binary control signal of "1000000" will provide an attenuation of −16 dB. For the purpose of this disclosure, an ON attenuator stage is defined to be in "attenuation mode" to provide a designed attenuation level. Conversely, an OFF attenuator stage is bypassed to provide no attenuation and defined to be in "insertion loss mode".

FIG. 2 is a schematic diagram of a prior art "pi" switchable attenuator circuit 102. To turn the attenuator circuit 102 ON (attenuation mode), bypass switch 200 is opened and shunt switches 202, 204 are closed, resulting in a conventional "pi" type attenuator configuration. To turn the attenuator circuit 102 OFF (insertion loss mode), bypass switch 200 is closed and shunt switches 202, 204 are opened, effectively bypassing the entire attenuator circuit 102. Control signals (not shown) of opposite logic state are used to concurrently open or close the various switches as indicated. The attenuation characteristics of a "pi" type attenuator are well known to those skilled in the art.

FIG. 3 is a schematic diagram of a prior art "bridged T" switchable attenuator circuit 104. To turn the attenuator circuit 104 ON (attenuation mode), bypass switch 300 is opened and shunt switch 302 is closed, resulting in a conventional "bridged T" type attenuator configuration. To turn the attenuator circuit 104 OFF (insertion loss mode), bypass switch 300 is closed and shunt switch 302 is opened, effectively bypassing the entire attenuator circuit 104. As noted above, control signals (not shown) of opposite logic state are used to concurrently open or close the various switches as indicated. The attenuation characteristics of a "bridged T" type attenuator are well known to those skilled in the art.

A problem with a conventional binary-weighted DSA 100 is that the component switching elements in the attenuator stages do not turn ON and OFF at the same rate. For field effect transistor (FET's) used as the switching elements, typically the turn ON time is faster than the turn OFF time. This creates a scenario in which various attenuator stages can temporarily present less attenuation as they are changing states, since all attenuator stages do not switch simultaneously. This asymmetrical switching produces a transient glitch at the DSA output. While the peak in output power lasts for only a short duration (tens of nanoseconds to a couple hundred nanoseconds) during an attenuation state change, if the power level is too great, the transient glitch can degrade the performance of or damage a system in which such a DSA is embedded.

The transient glitch from asymmetrical switching is worse for certain transitions than for others. For example, to switch a 7-bit DSA 100 from 15.75 dB attenuation to 16 dB attenuation requires toggling all seven of the control bits C16-C0.25 simultaneously, as shown in Table 1:

TABLE 1

| decimal code | C16 | C8 | C4 | C2 | C1 | C0.5 | C0.25 | Ideal Gain (dB) |
|---|---|---|---|---|---|---|---|---|
| 63 | 0 | 1 | 1 | 1 | 1 | 1 | 1 | −15.75 |
| 64 | 1 | 0 | 0 | 0 | 0 | 0 | 0 | −16.00 |

FIG. 4 is a diagram showing a switching glitch generated by a typical example of the prior art circuit shown in FIG. 1, for a worst case state transition. In this example, the measured positive glitch amplitude 400 in switching from one attenuation value 402 (−16 dB in this example) to another attenuation value 404 (−15.75 dB in this example) is larger than about 6 dB. When such a DSA is part of an automatic gain control loop (AGC) used to compensate for variations in received signal strength, such glitches may introduce an unwanted detection error. For other types of load devices or circuits, the peak power during a transition glitch may be damaging.

Accordingly, there is a need for a digital step attenuator circuit that reduces the amplitude of positive switching transients (glitches) during state transitions. The present invention addresses this need.

SUMMARY OF THE INVENTION

The invention is a method and circuit for significantly reducing positive switching transients (glitches) of digital step attenuators (DSA's) by controlling the timing of state transitions for individual attenuator stages within a DSA. Such control prevents the DSA output power from peaking during attenuation state transitions and ensures that any transient glitch during the transition results in reduced power at the DSA output. Attenuation stage timing delay can be implemented on an integrated circuit die or "chip" for monolithic implementations of a DSA by adding circuitry which ensures that any attenuation state changes result in increased attenuation rather than decreased attenuation, thereby reducing or eliminating positive transient glitches at the DSA output.

An aspect of the invention is to begin switching selected attenuator stages going from the OFF state (insertion loss mode) to the ON state (attenuation mode) first during attenuation state changes, and concurrently delaying the onset of attenuator stages going from the ON state (attenuation mode) to the OFF state (insertion loss mode) by a sufficient amount of time to ensure that any glitch present at the output would be in the direction of reduced output power to eliminate positive output glitches. This is accomplished by adding an attenuation state dependent delay element to the control timing of at least each most significant-bit individual attenuator stage in the DSA.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention is a method and circuit for significantly reducing positive switching transients (glitches) of digital step attenuators (DSA's) by controlling the timing of state transitions for individual attenuator stages within a DSA. Such control prevents the DSA output power from peaking during attenuation state transitions and ensures that any transient glitch during the transition results in reduced power at the DSA output. Attenuation stage timing delay can be implemented on an integrated circuit die or "chip" for monolithic implementations of a DSA by adding circuitry which ensures that any attenuation state changes result in increased attenuation rather than decreased attenuation, thereby reducing or eliminating positive transient glitches at the DSA output.

An aspect of the invention is to begin switching selected attenuator stages going from the OFF state (insertion loss mode) to the ON state (attenuation mode) first during attenuation state changes, and delaying the onset of attenuator stages going from the ON state (attenuation mode) to the OFF state (insertion loss mode) by a sufficient amount of time to ensure that any glitch present at the output would be in the direction of reduced output power to eliminate positive output glitches. This delay function is accomplished by adding an attenuation state dependent delay element to the control timing of at least each most significant-bit individual attenuator stage in the DSA.

Figure 1:
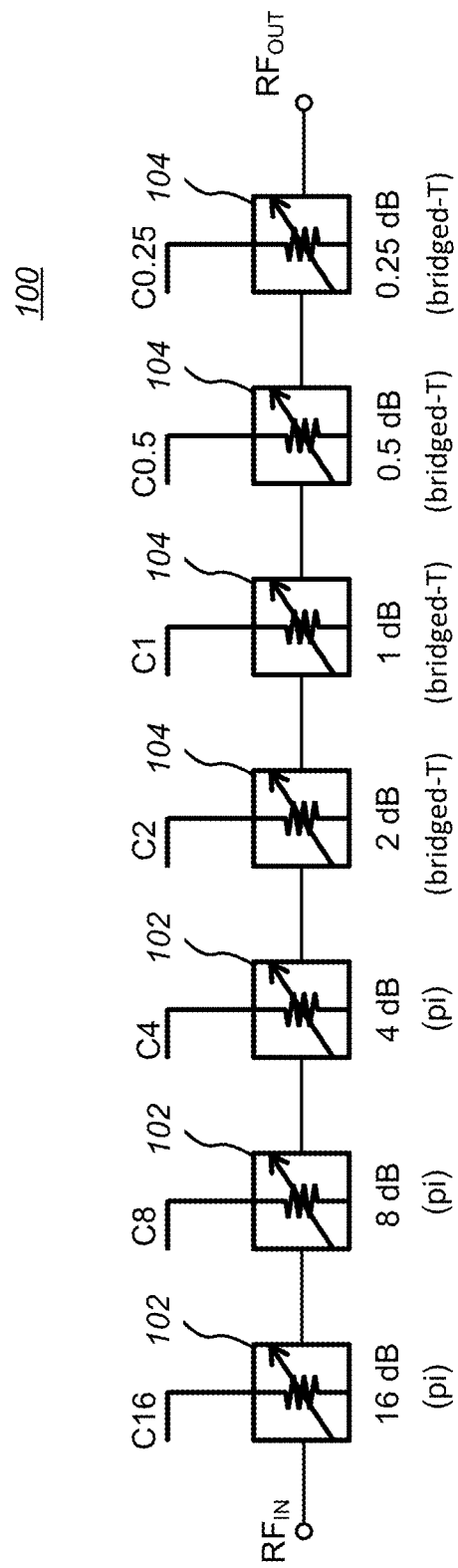
FIG. 1 is a schematic diagram of a typical prior art binary-weighted digital step attenuator.
Figure 2:
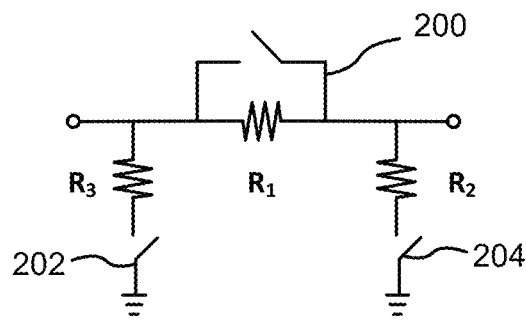
FIG. 2 is a schematic diagram of a prior art "pi" switchable attenuator circuit.
Figure 3:
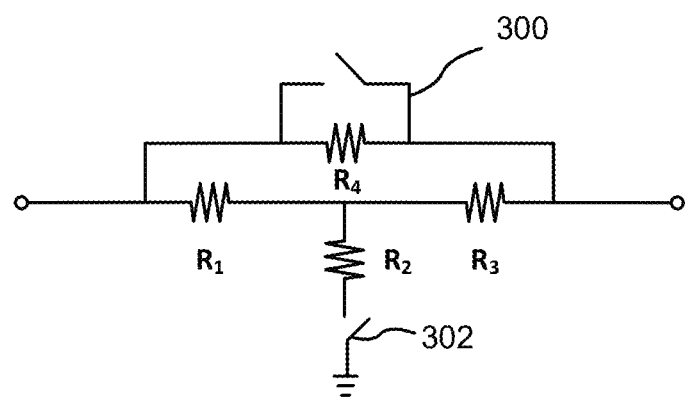
FIG. 3 is a schematic diagram of a prior art "bridged T" switchable attenuator circuit.
Figure 4:
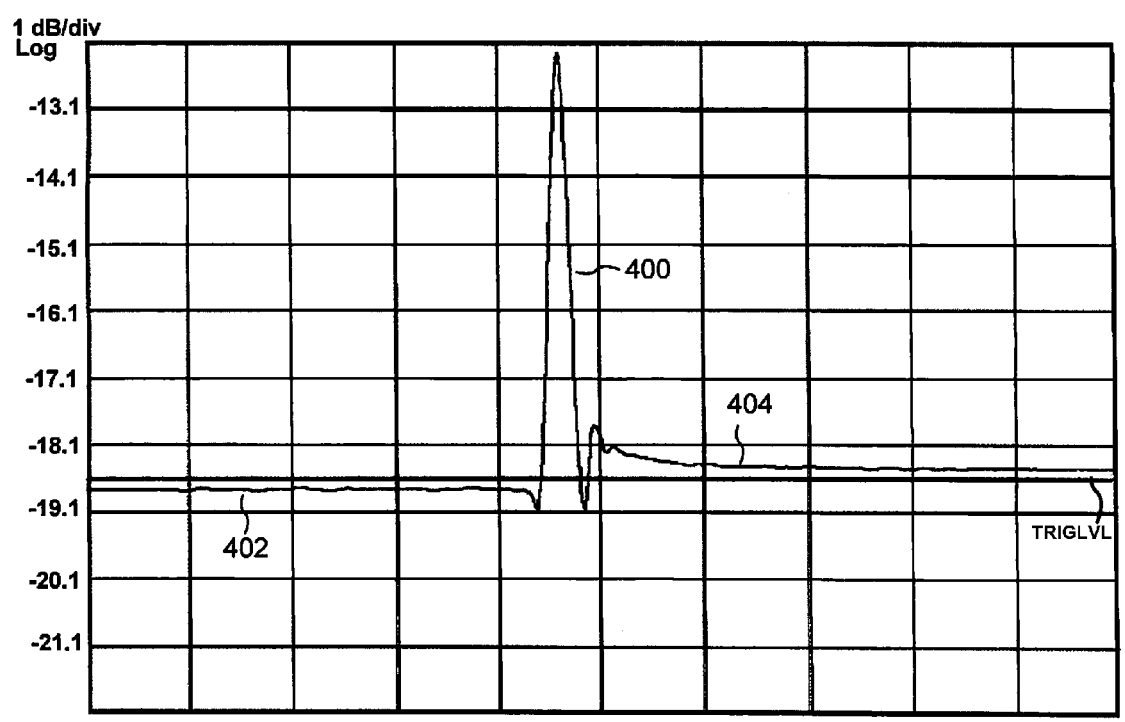
FIG. 4 is a diagram showing a switching glitch generated by a typical example of the prior art circuit shown in FIG. 1.
Figure 5:
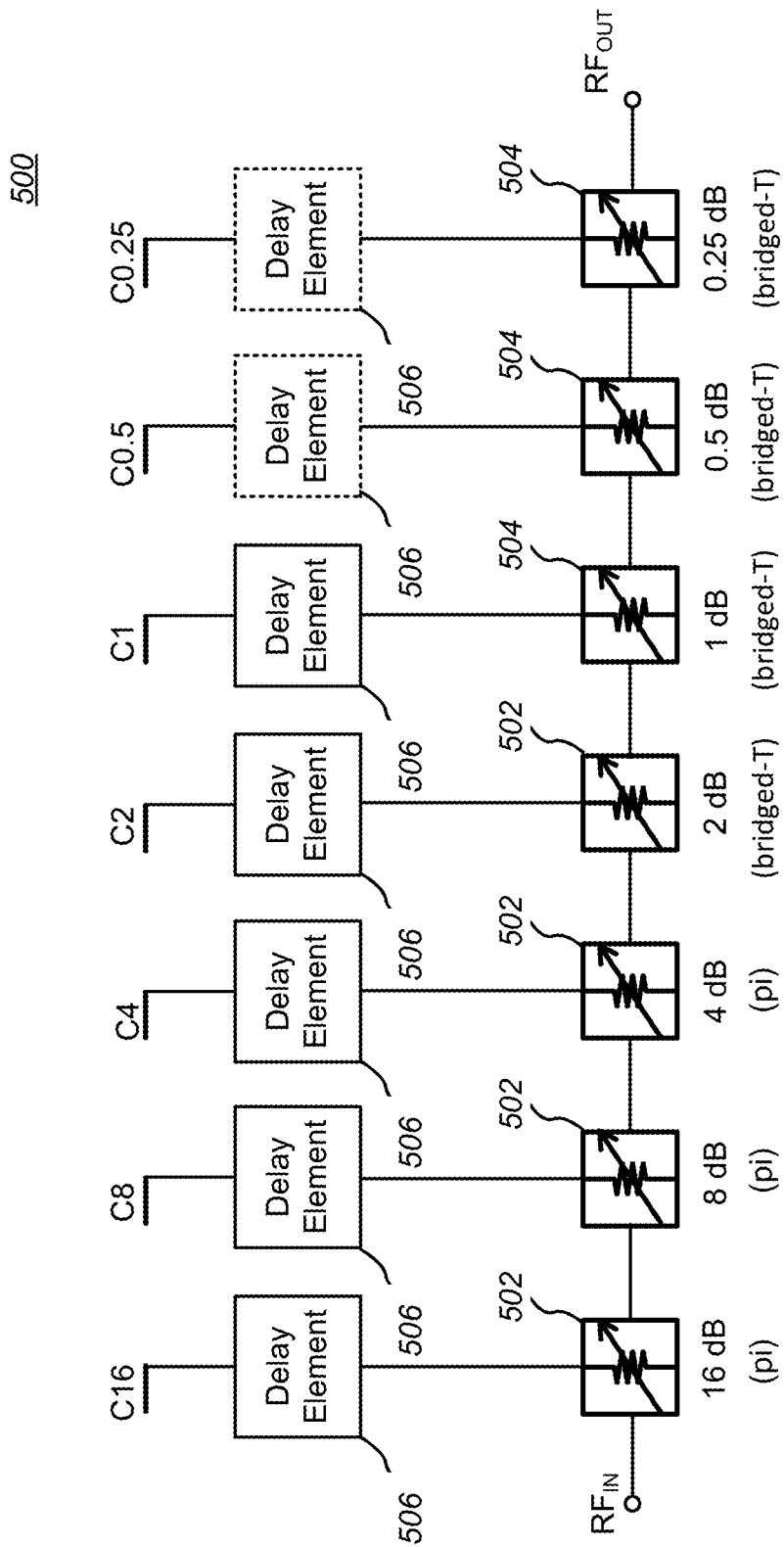
FIG. 5 is a schematic diagram of one embodiment of a digital step attenuator circuit in accordance with the present invention.

FIG. 5 is a schematic diagram of one embodiment of a digital step attenuator circuit 500 in accordance with the present invention. The illustrated circuit includes a multi-stage conventional DSA structure comprising series-connected "pi" type attenuator stages 502 and "bridged-T" type attenuator stages 504, similar to the structure shown in FIG. 1 (seven stages are shown; fewer or more stages may be used as required for particular applications). However, in the illustrated embodiment, at least each most significant-bit attenuator stage 502, 504 also includes a corresponding attenuation state dependent delay element 506.

For some applications, the attenuation state dependent delay elements may be omitted from one or more of the least significant bit attenuation stages, since they contribute only a small amount of output "glitch" power (e.g., the 0.25 dB and 0.5 dB attenuation stages, as indicated by dotted lines for the attenuation state dependent delay elements corresponding to those stages). Omission of attenuation state dependent delay elements for such LSB attenuation stages saves layout space and lowers overall power requirements in applications where the level of "glitch" produced by such stages is tolerable.

Figure 6:
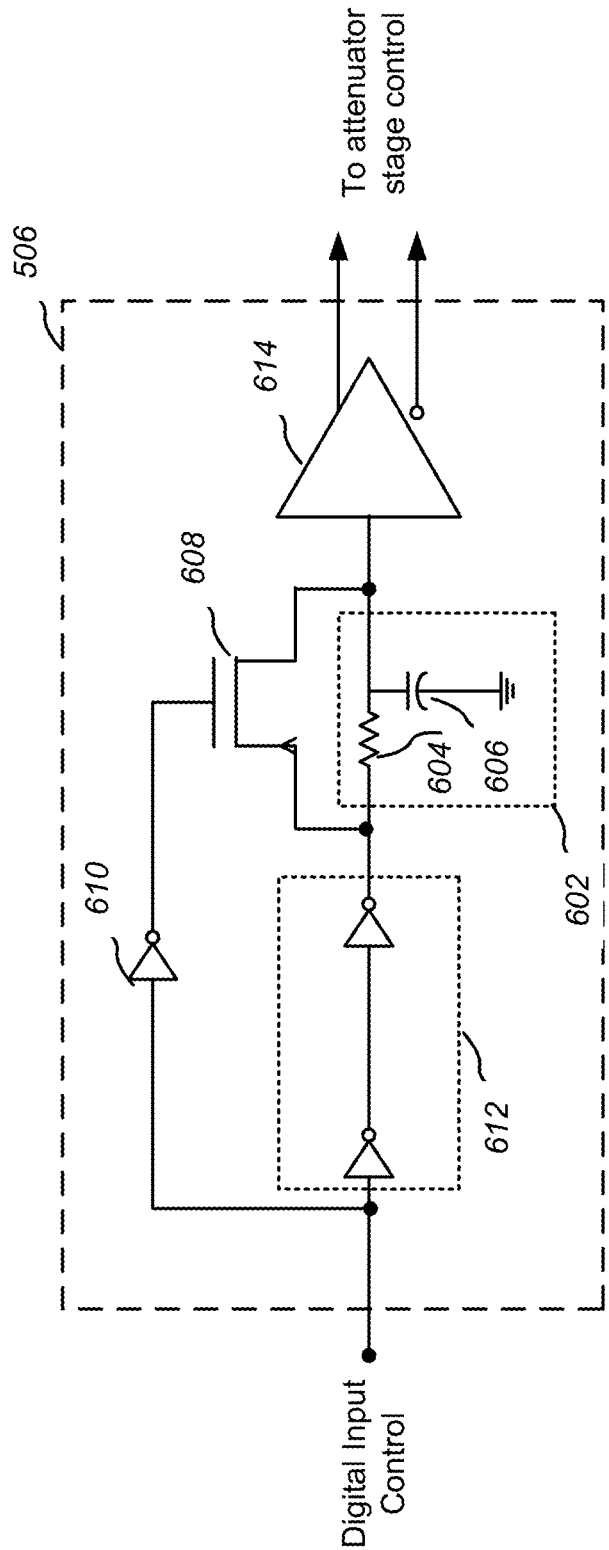
FIG. 6 is a schematic diagram of one embodiment of an attenuation state dependent delay element suitable for use in embodiments of the present invention.

FIG. 6 is a schematic diagram of one embodiment of an attenuation state dependent delay element 506 suitable for use in embodiments of the present invention. In the illustrated example, the delay element 506 uses a resistor-capacitor delay network 602 to introduce the required control timing delay. The resistor-capacitor delay network 602 comprises a series resistor 604 followed by a shunt capacitor 606 to ground. The resistor 604 and capacitor 606 values are chosen to introduce a sufficient time delay for an attenuator stage transitioning from the ON state (attenuation mode) to the OFF state (insertion loss mode) to allow other stages transitioning to the ON state (attenuation mode) to reach essentially full attenuation.

For an attenuator stage transitioning from the OFF state (insertion loss mode) to the ON state (attenuation mode), the time delay introduced by the resistor-capacitor delay network 602 is greatly reduced by bypassing the resistor element 604 with a switch 608 which is set to be normally ON (conducting); in the illustrated embodiment, the switch 608 is a PMOS FET. The ON (conducting state) resistance of the switch 608 is much lower than the resistance of the resistor 604 by several orders of magnitude. Accordingly, the RC delay introduced by the resistor-capacitor delay network 602 is much shorter if the switch 608 is conducting. For the embodiment shown in FIG. 6, this occurs when the digital control input transitions from a digital logic LOW to a digital logic HIGH, which corresponds to an individual attenuator stage transitioning from the OFF state (insertion loss mode) to the ON state (attenuation mode). Due to the presence of an inverter 610, such a transition would result in the gate voltage of the switch 608 switching from logic HIGH to logic LOW. The net result would be that the switch 608 switches from being OFF (non-conducting) to ON (conducting) to greatly reduce the delay of the delay element 506.

For an attenuator stage transitioning in the opposite direction, from the ON state (attenuation mode) to the OFF state (insertion loss mode), the reverse would occur, with the gate voltage of the switch 608 switching from a logic LOW to a logic HIGH. This corresponds to the switch 608 switching from ON (conducting) to OFF (non-conducting). Hence, the delay of the resistor-capacitor delay network 602 would remain intact.

Accordingly, the delay element 506 is asymmetric, causing switching of an attenuator stage from the ON state (attenuation mode) to the OFF state (insertion loss mode) to be slower than switching from the OFF state (insertion loss mode) to the ON state (attenuation mode).

For the circuit illustrated in FIG. 6, when using a PMOS FET for the switch 608, a signal propagation delay element 612 (shown as paired cascaded inverters) precedes the resistor-capacitor network 602 to prevent premature attenuator stage changes from the ON state (attenuation mode) to the OFF state (insertion loss mode). Without the signal propagation delay element 612, the resistor-capacitor delay network 602 would not be effective when the digital input control signal goes from a logic HIGH to a logic LOW because the digital input control signal would begin to leak through the switch 608 before the switch 608 can be turned OFF (non-conducting). This is because the gate voltage of the switch 608 is already at a logic LOW from the previous state (in insertion loss mode). Inclusion of the signal propagation delay element 612 introduces enough delay to ensure that the switch 608 can be turned OFF (non-conducting) before the digital input control signal arrives at the source of the switch 608 for the state transition under consideration.

The asymmetrically delayed digital control input is provided to an associated attenuator stage (not shown) through a buffer 614, which provides both normal and inverted outputs to control the attenuation and bypass elements of the associated attenuator stage in known fashion.

Thus, the attenuation state dependent delay elements 506 operate to ensure that at least the most significant-bit individual attenuator stages in a DSA begin to change state first if they are transitioning from the OFF state (insertion loss mode) to the ON state (attenuation mode), while the onset of the transition for individual attenuator stages which are changing from the ON state (attenuation mode) to the OFF state (insertion loss mode) are sufficiently delayed to prevent output power peaking at the DSA output.

Figure 7:
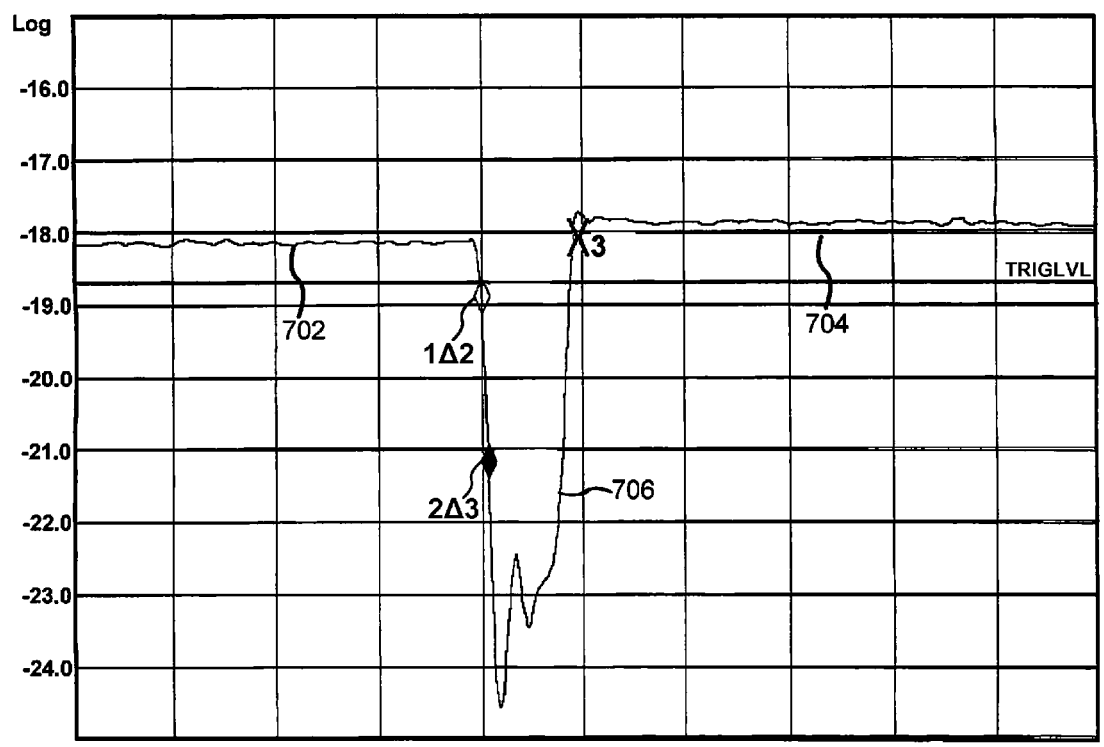
FIG. 7 is a diagram showing a reduced positive switching glitch typically generated by a circuit of the type shown in FIG. 5.

FIG. 7 is a diagram showing a reduced positive switching glitch typically generated by a circuit of the type shown in FIG. 5. Measurement of an actual integrated circuit embodiment has confirmed the effectiveness of the embodiment shown in FIG. 5. In this example, there is essential no measurable positive glitch amplitude in switching from one attenuation value 702 (−16 dB in this example) to another attenuation value 704 (−15.75 dB in this example). The "negative" glitch 706 shown does not present a significant issue for some applications, since in that "direction", attenuation is increased, not decreased.

The description in this disclosure is one embodiment of a circuit and method for eliminating or substantially reducing positive glitches in digital step attenuators. Other embodiments are possible, such as introducing the attenuation state dependent delay in the digital control section for an attenuator stage using sequential logic, whereby logic outputs would depend on both the present values of input signals as well as the past history of inputs. For example, the truth table of the digital control section for an attenuator stage might look like Table 2:

TABLE 2

| Old State | New State | Delay Output? |
|---|---|---|
| 0 | 0 | no |
| 0 | 1 | no |
| 1 | 0 | yes |
| 1 | 1 | no |

The delay needed in the digital control section may be implemented in any convenient manner, such as by a digital delay line, a counter, elapsed time of a real time clock, etc.

While the attenuator stages in the illustrated embodiment have been described as being "pi" type or "bridged T" type attenuators, other embodiments of the inventive DSA architecture may include other types of passive or active attenuators stages.

Another aspect of the invention includes a method for reducing glitches in a digital step attenuator comprising component attenuator stages having an insertion loss mode and an attenuation mode, including asymmetrically switching selected attenuator stages such that switching from the attenuation mode to the insertion loss mode is slower than switching from the insertion loss mode to the attenuation mode.

Yet another aspect of the invention includes a method for reducing glitches in a digital step attenuator, including:

STEP 1: providing a digital step attenuator comprising individually switchable connected attenuator stages, each attenuator stage having an insertion loss mode and an attenuation mode; and STEP 2: coupling an associated attenuation state dependent delay element to at least each most significant-bit attenuator stage, wherein each attenuation state dependent delay element causes switching of its associated attenuator stage from the attenuation mode to the insertion loss mode to be slower than switching from the insertion loss mode to the attenuation mode.

As should be readily apparent to one of ordinary skill in the art, the invention can be implemented to meet a wide variety of possible specifications. Thus, selection of suitable component values are a matter of design choice. The switching and passive elements may be implemented in any suitable IC technology, including but not limited to MOSFET and IGFET structures. Integrated circuit embodiments may be fabricated using any suitable substrates and processes, including but not limited to standard bulk silicon, silicon-on-insulator (SOI), and silicon-on-sapphire (SOS) processes.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A digital step attenuator circuit, including:
   (a) individually switchable connected attenuator stages, each attenuator stage having an insertion loss mode and an attenuation mode; and
   (b) attenuation state dependent delay elements, each associated with a corresponding one of such attenuator stages;
   wherein each attenuation state dependent delay element causes switching of its corresponding attenuator stage from the attenuation mode to the insertion loss mode to be slower than switching from the insertion loss mode to the attenuation mode.

2. The digital step attenuator circuit of claim 1, wherein each attenuation state dependent delay element includes a resistor-capacitor network and a coupled bypass switch, wherein the resistor-capacitor network provides a switching delay when its corresponding attenuator stage is to be switched from the attenuation mode to the insertion loss mode, and the bypass switch bypasses the switching delay of the resistor-capacitor network when the corresponding attenuator stage is to be switched from the insertion loss mode to the attenuation mode.

3. The digital step attenuator circuit of claim 1, wherein each attenuation state dependent delay element includes digital logic for causing a switching delay when its corresponding attenuator stage is to be switched from the attenuation mode to the insertion loss mode, and for not causing a switching delay when the corresponding attenuator stage is to be switched from the insertion loss mode to the attenuation mode.

4. The digital step attenuator circuit of claim 1, wherein the attenuation state dependent delay elements are associated only with corresponding most significant hit attenuator stages.

5. A digital step attenuator circuit, including:
(a) individually switchable connected attenuator stages, each attenuator stage having an insertion loss mode and an attenuation mode; and
(b) attenuation state dependent delay means for causing switching of selected attenuator stages from the attenuation mode to the insertion loss mode to be slower than switching from the insertion loss mode to the attenuation mode.

6. The digital step attenuator circuit of claim 5, wherein each attenuation state dependent delay means includes a resistor-capacitor network and a coupled bypass switch, wherein the resistor-capacitor network provides a switching delay when its corresponding attenuator stage is to be switched from the attenuation mode to the insertion loss mode, and the bypass switch bypasses the switching delay of the resistor-capacitor network when the corresponding attenuator stage is to be switched from the insertion loss mode to the attenuation mode.

7. The digital step attenuator circuit of claim 5, wherein each attenuation state dependent delay means includes digital logic means for causing a switching delay when its corresponding attenuator stage is to be switched from the attenuation mode to the insertion loss mode, and for not causing a switching delay when the corresponding attenuator stage is to be switched from the insertion loss mode to the attenuation mode.

8. A method for reducing glitches in a digital step attenuator comprising component attenuator stages having an insertion loss mode and an attenuation mode, including asymmetrically switching selected attenuator stages such that switching from the attenuation mode to the insertion loss mode is slower than switching from the insertion loss mode to the attenuation mode.

9. The method of claim 8, wherein the selected attenuator stages represent the most significant-bit attenuator stages.

10. A method for reducing glitches in a digital step attenuator, including:
(a) providing a digital step attenuator comprising individually switchable connected attenuator stages, each attenuator stage having an insertion loss mode and an attenuation mode; and
(b) coupling an associated attenuation state dependent delay element to at least each most significant bit attenuator stage, wherein each attenuation state dependent delay element causes switching of its associated attenuator stage from the attenuation mode to the insertion loss mode to be slower than switching from the insertion loss mode to the attenuation mode.

11. The method of claim 10, wherein each attenuation state dependent delay element includes a resistor-capacitor network and a coupled bypass switch, wherein the resistor-capacitor network provides a switching delay when its corresponding attenuator stage is to be switched from the attenuation mode to the insertion loss mode, and the bypass switch bypasses the switching delay of the resistor-capacitor network when the corresponding attenuator stage is to be switched from the insertion loss mode to the attenuation mode.

12. The method of claim 10, wherein each attenuation state dependent delay element includes digital logic element for causing a switching delay when its corresponding attenuator stage is to be switched from the attenuation mode to the insertion loss mode, and for not causing a switching delay when the corresponding attenuator stage is to be switched from the insertion loss mode to the attenuation mode.

* * * * *